(12) United States Patent
Gass et al.

(10) Patent No.: US 7,439,744 B2
(45) Date of Patent: Oct. 21, 2008

(54) AUTOMATED ARC GENERATOR AND METHOD TO REPEATABLY GENERATE ELECTRICAL ARCS FOR AFCI TESTING

(75) Inventors: Dale Louis Gass, Brown Deer, WI (US); Kevin Lynn Parker, Pittsburgh, PA (US); Birger Pahl, Milwaukee, WI (US); Jerome Kenneth Hastings, Sussex, WI (US); Joseph Charles Zuercher, Brookfield, WI (US)

(73) Assignee: Eaton Corporation, Cleveland, OH (US)

( * ) Notice: Subject to any disclaimer, the term of this patent is extended or adjusted under 35 U.S.C. 154(b) by 39 days.

(21) Appl. No.: 11/591,062

(22) Filed: Nov. 1, 2006

(65) Prior Publication Data

US 2008/0100305 A1    May 1, 2008

(51) Int. Cl.
  *G01R 31/327*  (2006.01)
  *G01R 31/08*  (2006.01)
  *H02H 3/00*  (2006.01)
(52) U.S. Cl. .................. 324/424; 324/536; 361/42
(58) Field of Classification Search ............. 324/536, 324/512, 500, 415, 424; 200/10, 400, 50.26; 218/1, 120, 140, 153; 361/40, 253, 255, 361/256, 257, 261, 262, 263, 1, 42
See application file for complete search history.

(56) References Cited

U.S. PATENT DOCUMENTS 5,334,939 A * 8/1994 Yarbrough .................. 324/424
5,459,630 A * 10/1995 MacKenzie et al. ............ 361/45
5,834,940 A * 11/1998 Brooks et al. ................ 324/424
6,313,641 B1 * 11/2001 Brooks ........................ 324/536
6,426,632 B1 * 7/2002 Clunn ......................... 324/509
2002/0024782 A1 * 2/2002 Kim et al. ..................... 361/42

OTHER PUBLICATIONS

"Arc-Fault Circuit Interrupters (AFCIs)—Type and Performance Considerations", Underwriters Laboratories Inc., 2001.

* cited by examiner

*Primary Examiner*—Vincent Q. Nguyen
*Assistant Examiner*—Hoai-an D Nguyen
(74) *Attorney, Agent, or Firm*—Martin J. Moran

(57) ABSTRACT

An apparatus for repeatably generating electrical arcs for testing an electrical switching device, such as an arc fault circuit interrupter, includes a stationary electrode and a movable electrode that is moved along a path of travel by an electromechanical device under the control of a controller that receives data from either a current measuring device or a voltage measuring device to detect the initiation of an arc. The movable electrode is caused to first make physical contact with the stationary electrode, and then is moved away from the stationary electrode until an arc is detected. Additionally, the movable electrode may be moved towards and away from the stationary electrode according to a test profile to control the magnitude of the randomness of the arc.

9 Claims, 7 Drawing Sheets

AUTOMATED ARC GENERATOR AND METHOD TO REPEATABLY GENERATE ELECTRICAL ARCS FOR AFCI TESTING

BACKGROUND OF THE INVENTION

1. Field of the Invention

This invention pertains generally to test apparatus, and more particularly, to such apparatus for repeatably generating electrical arcs for testing an electrical switching apparatus, such as an arc fault circuit interrupter (AFCI). The invention also relates to methods for testing AFCIs.

2. Background Information

Electrical switching apparatus, such as circuit interrupters (e.g. and without limitation, arc fault circuit interrupters (AFCIs), ground fault circuit interrupters (GFCIs), and current leakage detectors), are employed in a wide variety of electrical power circuits to protect people and/or equipment from various electrical faults, including short circuits, defective grounding and arcing between power conductors. To ensure the reliability and consistent behavior of such devices, various private and/or government agencies have put forward minimum safety specifications, as well as specifications for conducting tests of compliance with those safety specifications.

An unfortunate feature of wiring with current day plastic insulators used both within the walls of a structure and in open spaces (e.g. and without limitation, appliance cords and extension cords) is the formation, over time, of quantities of carbon molecules between electrical conductors or across gaps resulting from breaks in electrical conductors. The formation of these quantities of carbon molecules in such locations is often hastened by such wiring being subjected to repeated physical abuse, and this hastening most often occurs in extension cords or appliance cords lying across floor surfaces where they are repeatedly stepped on, rolled over with carts, pinched under or between pieces of furniture, etc. As such quantities of carbon molecules form between conductors or across the gaps of broken conductors, they can become intermittent conductors, themselves, causing electrical arcing to occur that has been known to start fires. One of the responses to this problem with these cords has been the creation of AFCIs that respond to the occurrences of such arcs by disconnecting power from wires in which arcing occurs in a manner not unlike that of a circuit breaker. In an effort to ensure the reliability of these AFCIs, Underwriters Laboratories, Inc. (UL), has promulgated standards for minimum characteristics of such AFCIs and for testing such AFCIs, including the UL1699 standard.

Section 58.1.3 of UL1699 specifies the details of an arc generator to be used in simulating arcs for the purpose of testing AFCIs. The specified design employs a rack and pinion with a hand crank to allow an operator to manually separate a carbon electrode and a copper electrode to create an arc. In normal use, an operator begins by bringing the carbon and copper electrodes into contact with each other before turning on the power, and then the operator very slowly separates the electrodes until the operator (wearing protective eyewear with darkened lenses) sees an electrical arc initiated between the electrodes. Unfortunately, creating arcs that last long enough to permit an AFCI to be properly tested with such a hand-operated apparatus has proven difficult. The typical distances by which these electrodes must be separated to initiate and maintain an arc are measurable in micrometers or fractions of a micrometer, and have a similarly minute range of error. Indeed, the distances are sufficiently minute and human hand-eye coordination is sufficiently sluggish, that it is often the case that by the time the operator is able to see, comprehend and respond to the initiation of an arc by ceasing to further separate the electrodes, the operator has already separated the electrodes by too great a distance, and the arc is extinguished only a moment after being initiated (what is commonly called a "blow-out").

Even where an individual has developed considerable skill in using such a hand-operated apparatus to create sustained arcs with some regularity, there are still drawbacks. Given the previously mentioned minute tolerances for error, a hand-operated arc generator is not conducive to altering the distance between the electrodes by controllable amounts to provide either refinement of or control over the properties of an arc. Also, operator fatigue can quickly set in from having to do the delicate work of generating arcs a number of times to perform a range of different tests on even a single AFCI. There are also concerns that having an operator repeatedly watching the initiation of arcs, even with the protection of darkened lenses, may have damaging long term effects on eyesight. Furthermore, such a hand-operated apparatus requiring precision of hand-eye coordination to generate each arc is simply not conducive to carrying out tests of even limited production runs of AFCIs.

SUMMARY OF THE INVENTION

These needs and others are met by embodiments providing an arc generator employing automated and programmable control of the relative positions of electrodes to repeatably generate electrical arcs and to maintain those arcs for periods of time sufficient to enable testing of electrical switching devices, such as AFCIs. In some embodiments, various forms of stepper motor or other electromechanical device (or in the alternative, and without limitation, some form of pneumatic or hydraulic device) are employed to controllably move at least one electrode away from another electrode, and in some embodiments, various forms of electrical measuring device are employed to detect the initiation of an arc by detecting an electrical event caused by the initiation of an arc such as a change in the flow of current through an electrode, or a change in the differential voltage between two electrodes.

In some embodiments that are additionally provided with a recording device, testing profiles may be developed and repeatably tested by observing characteristics of an arc as a function of distance between electrodes. Furthermore, in some embodiments employing more than a pair of electrodes, multiple arcs between electrodes may be simultaneously and repeatably generated to simulate arcs in wiring having characteristics of greater magnitude than are effectively simulated with only a single arc between electrodes.

In accordance with one aspect of the invention, an apparatus comprises a stationary frame; a movable frame; a first electrode mounted to, but electrically isolated from, the stationary frame; a second electrode mounted to, but electrically isolated from, the movable frame; an electromechanical device rigidly connected to the stationary frame and drivingly connected to the movable frame to move the movable frame along a path of travel to move the second electrode into and out of contact with the first electrode; and a controller structured to operate the electromechanical device, to receive data providing an indication of initiation of an arc between the first electrode and the second electrode from at least one electrical measuring device detecting an electrical event indicative of an initiation of an arc, to operate the electromechanical device to move the second electrode away from contact with the first electrode, and to operate the electromechanical device to alter movement of the second electrode in response to receiving the indication of initiation of an arc between the first electrode and the second electrode, the alteration of movement being to either cease movement or to change the direction and/or speed of movement.

In accordance with another aspect of the invention, an apparatus comprises a stationary frame; a movable frame; an additional movable frame; a first electrode mounted to the stationary frame; a second electrode mounted to the movable frame; a third electrode mounted to the additional movable frame; an electromechanical device rigidly connected to the stationary frame and drivingly connected to the movable frame and to the additional movable frame to move the movable frame to move the second electrode into and out of contact with the first electrode, and to move the additional movable frame to move the third electrode into and out of contact with the first electrode; and a controller structured to operate the electromechanical device to move the second electrode into contact with the first electrode and to move the third electrode into contact with the first electrode, to receive data from at least one electrical measuring device providing an indication of initiation of at least one of an arc between the first electrode and the second electrode and an arc between the first electrode and the third electrode, to operate the electromechanical device to move the second electrode away from contact with the first electrode and move the third electrode away from contact with the first electrode, and to operate the electromechanical device to alter movement of the second electrode and the third electrode in response to receiving the indication of initiation.

In accordance with another aspect of the invention, a method of testing an electrical switching device comprises moving a second electrode into contact with a first electrode; moving the second electrode away from the first electrode; and altering movement of the second electrode away from the first electrode, as by either stopping movement or changing the direction and/or speed of movement, in response to an indication of at least one electrical event from at least one electrical measuring device indicative of an initiation of an arc between at least the first electrode and the second electrode.

In accordance with another aspect of the invention, a machine-readable medium stores a sequence of instructions that when executed by a processor causes the processor to perform operations comprising operating an electromechanical device under the control of the processor to move a second electrode into contact with a first electrode; operating the electromechanical device to move the second electrode out of physical contact with the first electrode; and operating the electromechanical device to alter movement of the second electrode in response to receiving an indication of at least one electrical event indicative of an initiation of an arc between the first electrode and the second electrode.

In some embodiments that are additionally provided with a recording device, testing profiles may be developed and repeatably tested by observing characteristics of an arc as a function of distance between electrodes. Furthermore, in some embodiments employing more than a pair of electrodes, multiple arcs between electrodes may be simultaneously and repeatably generated to simulate arcs in zip cords having characteristics of greater magnitude than are effectively simulated with only a single arc between electrodes.

In some embodiments, the altering of movement of an electrode upon receiving an indication of at least one electrical event indicative of an initiation of an arc entails ceasing movement. In such embodiments, the cessation of movement may be followed by other movement to adjust one or more characteristics of the arc, including and without limitation, randomness, differential voltage between the electrodes, and current through the electrodes. In other embodiments, the altering of movement of an electrode upon receiving an indication of at least one electrical event indicative of an initiation of an arc entails changing the direction and/or speed of movement. Whether altering movement after receipt of the indication entails ceasing movement or changing the speed and/or direction of movement, at least one movement of an electrode following receipt of the indication may be performed as part of a test procedure.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
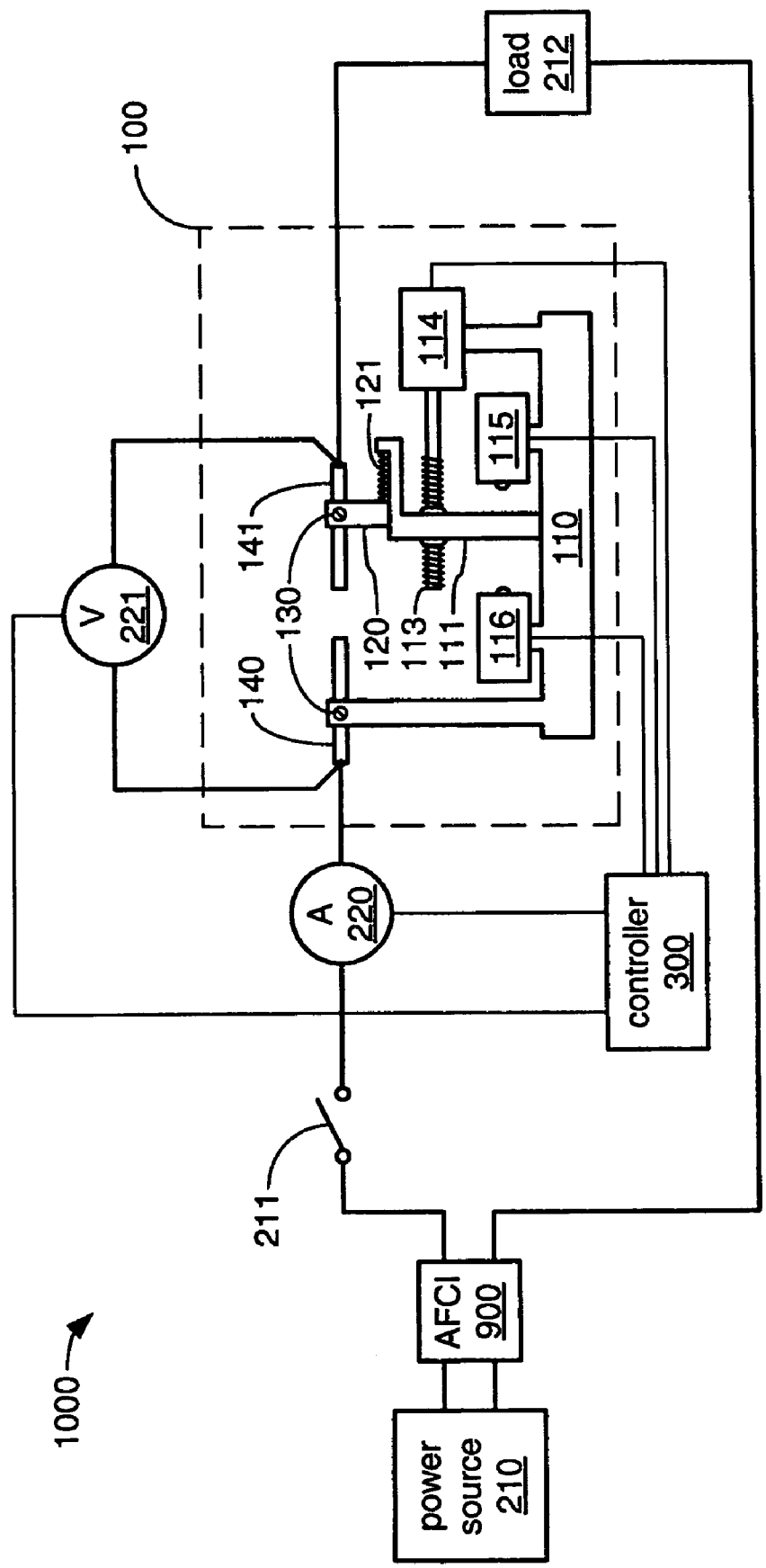
FIG. 1 is a block diagram of a testing apparatus in accordance with an embodiment of the invention.

Referring to FIG. 1, a testing apparatus 1000 for testing an electrical switching device such as arc fault circuit interrupter (AFCI) 900 incorporates an arc generator 100 coupled to a power source 210, a power switch 211, a load 212, a controller 300, and at least one electrical measuring device such as one or both of a current measuring device 220 and a voltage measuring device 221. The arc generator 100 incorporates a stationary frame 110 relative to which a movable frame 111 is slidably moved by an electromechanical device mounted on the stationary frame 110 such as a stepper motor 114 driving a worm gear 113 or other suitable mechanical linkage. One or both of limit switches 115 and 116 may also be affixed to the stationary frame 110 to be engaged by the movable frame 111 as the movable frame 111 moves relative to the stationary frame 110. Carried by the stationary frame 110 is an electrode 140, and carried by the movable frame 111 is an accompanying electrode 141. In some embodiments, one of the electrodes 140 and 141 is made of carbon and the other of the electrodes 140 and 141 is made of copper. One or both of the electrodes 140 and 141 may optionally be affixed to the stationary frame 110 and the movable frame 111, respectively, in a manner that allows slidable adjustment towards or away from each other such that one or both of the electrodes 140 and 141 may be clampingly engaged by way of one or more of set screws 130 or other form of attachment hardware. Additionally, a micrometer (not shown) may be incorporated into such mounting hardware or be otherwise employed to aid in this adjusting of the relative positions of the electrodes 140 and 141. Also, the electrode 141 may either be rigidly carried by the movable frame 111, or may be flexibly carried by the movable frame 111 by way of an electrode mount 120 that is slidably connected to the movable frame 111 through a spring 121.

The power source 210 provides the power used in testing the AFCI 900, or other electrical switching device. One conductor supplied by the power source 210 proceeds through the AFCI 900 and the power switch 211, when the power switch 211 is closed, and to the electrode 140. The current measuring device 220 may optionally be installed between the power switch 211 and the electrode 140 to monitor the flow of current therebetween. As those skilled in the art will understand, the current measuring device 220 may either be of a type that is electrically connected in series between the power switch 211 and the electrode 140, or may be of a type positioned adjacent a conductor (e.g., clamped around a conductor) connecting the power switch 211 to the electrode 140. The other conductor supplied by the power source 210 is also electrically connected to the AFCI 900 and proceeds to the load 212. Another conductor is electrically connected between the electrode 141 and the load 212. The voltage measuring device 221 is coupled to both of electrodes 140 and 141 to monitor a differential voltage therebetween.

The controller 300 operates the stepper motor 114 to slidably move the movable frame 111 relative to the stationary frame 110, and may optionally be coupled to one or both of the limit switches 115 and 116 to detect when the movable frame 111 has been moved to predetermined limits towards or away from the stepper motor 114. The controller 300 may also receive input from one or both of the current measuring device 220 and the voltage measuring device 221 to detect the presence and/or the characteristics of an arc between the electrodes 140 and 141. The controller 300 may be manually operated to effect movement of the movable frame 111 to move the electrode 141 towards or away from the electrode 140. Alternatively, as will be explained in greater detail, the controller 300 may be programmed or otherwise configured to automatically effect movement of the movable frame 111 as part of initiating and/or controlling characteristics of an arc between the electrodes 140 and 141 to perform tests of the AFCI 900, or other electrical switching device.

In performing a test of the AFCI 900, or other electrical switching device, in which an arc is to be generated between the electrodes 140 and 141, the power switch 211 is first opened (if the power switch 211 is not already open) and then the controller 300 is caused to operate the stepper motor 114 to move the movable frame 111 to move the electrode 141 into contact with the electrode 140. In embodiments in which the electrode 141 is slidably connected to the movable frame 111 by way of a combination of the electrode mount 120 and the spring 121, or other similar mechanism, the need to precisely determine the location of the movable frame 111 at which the electrodes 140 and 141 make sufficient contact may be obviated. The spring 121 allows the movable frame 111 to be moved some distance further than necessary for contact to be made while the spring 121 prevents the electrodes 140 and 141 from being damaged. In embodiments where a combination of carbon and copper electrodes are used, the spring 121 also compensates for changes in length of whichever one of the electrodes 140 and 141 is made of carbon, as carbon molecules are lost and the length of the carbon electrode is slightly reduced each time an arc is generated between the electrodes 140 and 141.

After the electrodes 140 and 141 are in contact with each other, the power switch 211 is closed to cause a flow of current generated by the power source 210 across the electrodes 140 and 141 and through load 212. The controller 300 is then caused to operate the stepper motor 114 to move the electrode 141 away from the electrode 140 at a slow enough speed to allow both the initiation of an arc between the electrodes 140 and 141 to be detected and the movement of the electrode 141 away from the electrode 140 to be altered in response to the initiation of the arc. In altering the movement of the electrode 141 away from the electrode 140, the movement of the electrode 141 may simply be stopped in order to simply preserve the initiated arc, or the speed and/or direction of the movement of the electrode 141 may be changed, possibly under the control of a test procedure to vary a characteristic of the arc, as will be explained.

The initiation of an arc may be detected by monitoring with an electrical measuring device for one or more electrical events indicative of initiation of an arc in which the flow of current through and/or the voltage across the electrodes 140 and 141 changes. Monitoring for an electrical event indicative of an initiation of an arc can result in a faster response to the initiation of an arc than is possible by watching for a visible sign of the initiation of an arc, because such an indicative electrical event can occur before there is a visible sign. In some embodiments, the initiation of an arc may be detected by the controller 300 through the detection of an arc voltage between the electrodes 140 and 141 by the voltage measuring device 221. Typically, the arc voltage between a copper electrode and a carbon electrode is within a few volts of 20 volts. In other embodiments, the initiation of an arc may be detected by the controller 300 through the detection by the current measuring device 220 of a flow of current through the electrode 140 of a magnitude that is almost as great as the magnitude of current flow present when the electrodes 140 and 141 were in contact with each other.

In some embodiments, upon detecting the initiation of an arc across the electrodes 140 and 141, the controller 300 may be caused to operate the stepper motor 114 to alter movement of the electrode 141 away from the electrode 140 by simply ceasing the movement of the electrode 141 away from the electrode 140. Simply ceasing movement of the electrode 141 away from the electrode 140 may be done to prevent the distance between the electrodes 140 and 141 from becoming too great to support an arc, thereby causing the arc that was just initiated to be lost (i.e., "quenched"). The controller 300 may be further caused to simply maintain the electrode 141 at the point at which movement of the electrode 141 was ceased to simply maintain the arc. Alternatively, after ceasing the movement of the electrode 141, the controller 300 may be further caused to move the electrode 141 towards and/or away from the electrode 140 to vary a characteristic of the arc that is affected by the distance between the electrodes 140 and 141, such as, and without limitation, the randomness of the arc.

In other embodiments, upon detecting the initiation of an arc across the electrodes 140 and 141, the controller 300 may be caused to operate the stepper motor 114 to alter movement of the electrode 141 away from the electrode 140 by changing the speed and/or direction of movement of the electrode 141 to adjust the position of the electrode 141 towards or away from the electrode 140 to increase or decrease the randomness of at least one characteristic of the arc.

Regardless of the form of the alteration of movement of the electrode 141 away from the electrode 140, such an alteration of movement or at least one subsequent movement of the electrode 141 may be performed as part of the execution of a test procedure. When the arc need no longer be maintained, the arc may be caused to cease by causing the controller 300 to operate the stepper motor 114 to move the electrode 141 further away from the electrode 140 to a distance too great for an arc to be maintained, causing the controller 300 to move the electrode 141 into contact with the electrode 140, or opening the power switch 211 to interrupt the flow of current.

Figure 2:
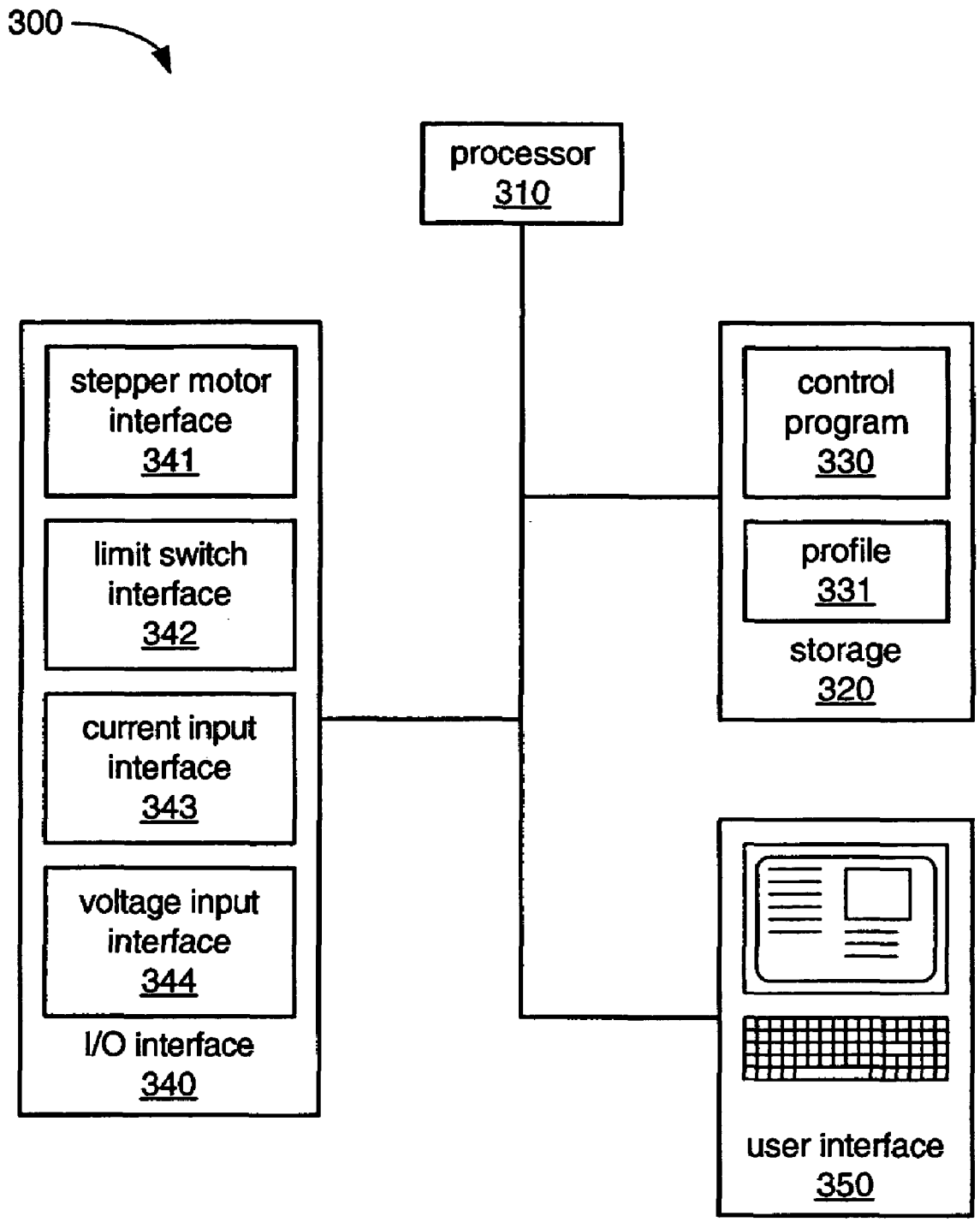
FIG. 2 is a block diagram of a controller of the testing apparatus of FIG. 1.

Referring to FIG. 2, an embodiment of the controller 300 of FIG. 1 incorporates a processor 310 coupled to a storage 320, an I/O interface 340 and a user interface 350. The processor 310 may be any of a variety of types of processing device, including, for example, a specialized processor such as a DSP, or a more general function processor such as a processor executing the widely known and used "X86" instruction set. The storage 320 is a machine readable storage device that may be made up of volatile and/or non-volatile forms of storage devices including, but not limited to, RAM, ROM, FLASH, EPROM, and magnetic and/or optical machine readable media, that may or may not be of a removable form. The I/O interface 340 couples the processor 310 to the stepper motor 114, one or both of the limit switches 115 and 116, and one or both of the current measuring device 220 and the voltage measuring device 221 of FIG. 1. The user interface 350 may incorporate, for example, a screen and keyboard, as depicted, or may incorporate any of a variety of widely known and used user interface devices, such as a touchscreen, various switches and/or hand-operable controls, audio and/or voice interfaces.

The storage 320 carries at least a suitable control program 330 incorporating a sequence of instructions that when executed by the processor 310, enables the processor 310 to control the stepper motor 114 and receive input from the limit switches 115 and 116, the current measuring device 220 and the voltage measuring device 221 through the stepper motor interface 341, the limit switch interface 342, the current input interface 343 and the voltage input interface 344, respectively, of the I/O interface 340. Although the controller 300 in FIG. 2 may employ a direct connection between the processor 310, storage 320, I/O interface 340 and user interface 350, it will be understood by those skilled in the art that one or more of these may be more remotely located from the others and employ remote access through a network or other suitable communications mechanism.

In controlling the stepper motor 114 to move the electrode 141 towards and away from the electrode 140 as part of carrying out a test or other operations, the processor 310 accesses the storage 320 to read portions of the control program 330. When carrying out a test, the control program 330 causes the processor 310 to operate the stepper motor 114 to move the electrode 141 into contact with the electrode 140, and then move the electrode 141 away from the electrode 140 and alter that movement upon the initiation of an arc is detected through either the current measuring device 220 or the voltage measuring device 221, as previously discussed. It has been determined that employing the processor 310 to control the movement of the electrode 141 relative to the electrode 140 through the stepper motor 114 enables greater repeatability in generating and maintaining an arc between the electrodes 140 and 141 than is possible with hand operation by a human being. By monitoring either the current measuring device 220 or the voltage measuring device 221 for either a current level or a differential voltage indicative of an arc between the electrodes 140 and 141, the processor 310 executing the control program 330 is able to respond much more quickly in altering movement of the electrode 141 away from the electrode 140 to maintain the arc than a human being attempting to stop himself/herself from continuing to move the electrode 141 with a hand-operated apparatus upon seeing the initiation of an arc. To put it more simply, the processor 310 is able to respond far faster than is possible with human hand-eye coordination to take action to maintain an arc once it has been initiated.

However, the benefits of replacing a human being with the processor 310 executing the control program 330 are not limited to greater speed in responding to the initiation of an arc in order to maintain it. With other suitable forms of the control program 330, the processor 310 is capable of monitoring either the current measuring device 220 or the voltage measuring device 221 to record a profile of arc characteristics as a function of distance between the electrodes 140 and 141. Arcs are known to have considerable random behavior in which the amount of current flowing through an arc and the differential voltage between the ends of an arc randomly fluctuate. However, it has been determined that it is possible to controllably increase and decrease this randomness by making minute changes in the distance between the electrodes 140 and 141 as long as a distance at which an arc quenches is not reached. Indeed, it has proven possible to exercise some control over the magnitude of the fluctuations in current and differential voltage by controlling the distance to enough of a degree that a profile 331 for testing the AFCI 900 or another electrical switching device may be created to subject such an electrical switching device to a sequence of magnitudes of such fluctuations that are chosen and timed to test different aspects of the responsiveness of such an electrical switching device to the occurrence of an arc.

Figure 3:
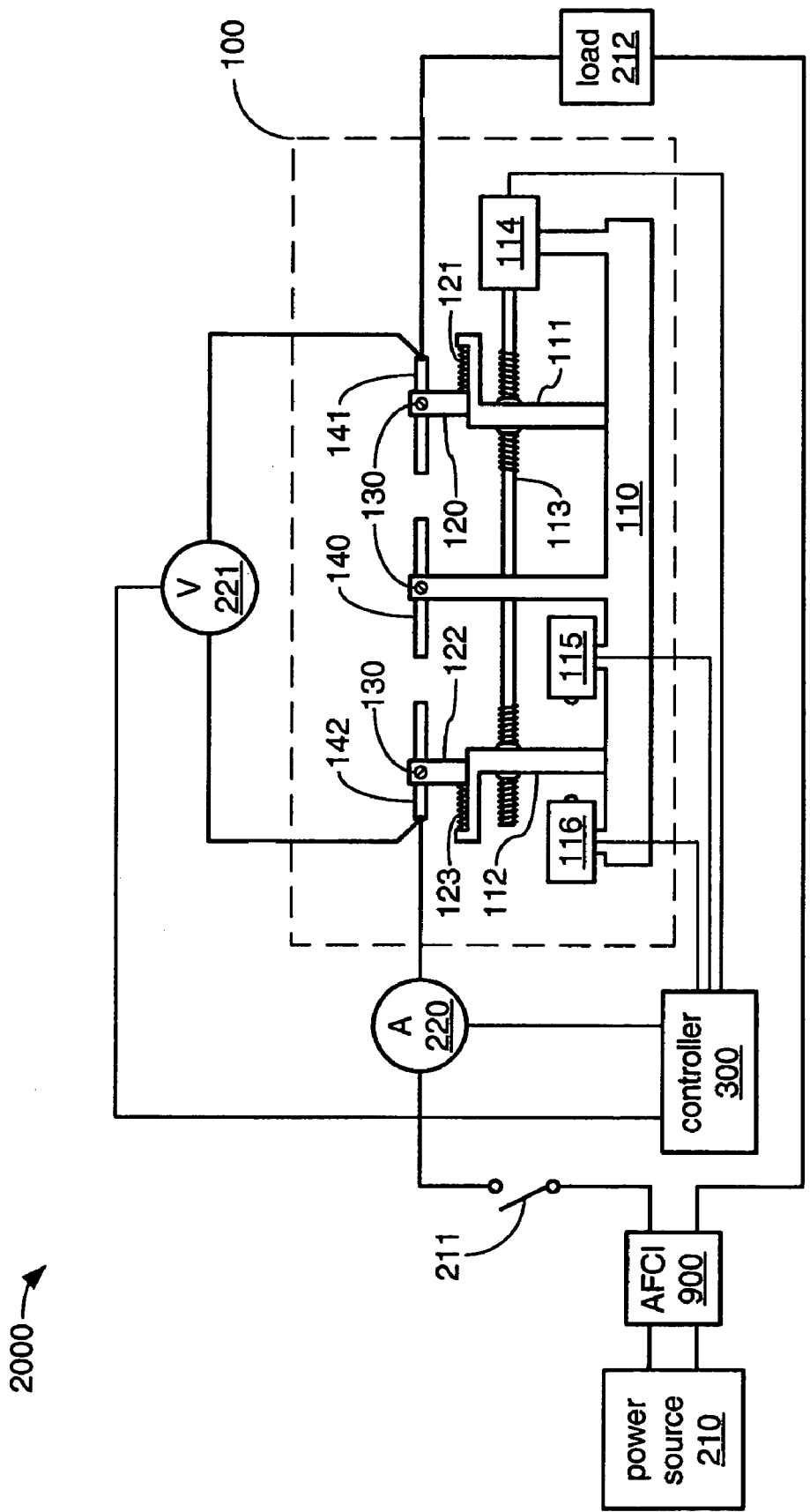
FIGS. 3, 4 and 5 are block diagrams of testing apparatus or apparatuses in accordance with other embodiments of the invention.

FIG. 3 depicts another testing apparatus 2000 to test the AFCI 900. The testing apparatus 2000 is substantially similar to the testing apparatus 1000 of FIG. 1, and accordingly, the majority of numbered items of are identical, or at least substantially similar, between the testing apparatus 1000 and the testing apparatus 2000, and therefore, have been designated with identical numbering. The most substantial difference is that the testing apparatus 2000 employs three electrodes in a tandem arrangement to repeatably generate two arcs to test the AFCI 900, whereas the testing apparatus 1000 employs only two electrodes to repeatably generate a single arc to test the AFCI 900.

More specifically, like the testing apparatus 1000 of FIG. 1, the testing apparatus 2000 of FIG. 3 incorporates an arc generator 100 coupled to a power source 210, a power switch 211, a load 212, a controller 300, and at least one electrical measuring device such as one or both of a current measuring device 220 and a voltage measuring device 221. However, unlike the testing apparatus 1000, the arc generator 100 of the testing apparatus 2000 incorporates a stationary frame 110 relative to which movable frames 111 and 112 are slidably moved by an electromechanical device mounted on the stationary frame 110 such as a stepper motor 114 driving a worm gear 113 or other suitable mechanical linkage. The worm gear 113 depicted in FIG. 3 is configured such that the threads of worm gear 113 that engage one of the movable frames 111 and 112 are formed in an orientation opposite the threads of worm gear 113 that engage the other of the movable frames 111 and 112, such that the movable frames 111 and 112 are caused to move towards each other when the worm gear 113 is rotated in one direction, and caused to move away from each other when the worm gear 113 is rotated in the opposite direction. One or both of limit switches 115 and 116 may optionally also be affixed to the stationary frame 110 to be engaged by one or the other of the movable frames 111 and 112 (although as depicted, movable frame 112 engages the limit switches 115 and 116) during movement relative to the stationary frame 110.

Carried by the stationary frame 110 is an electrode 140, carried by the movable frame 111 is an electrode 141, and carried by the movable frame 112 is an electrode 142. As can be seen in FIG. 3, the electrodes 140-142 are arranged in a tandem configuration such that the electrode 140 is positioned between the electrodes 141 and 142 to provide the equivalent function of two distinct pairs of electrodes. To enable the generation of arcs, an electrode made of copper must make and break contact with an electrode made of carbon, and therefore, given this tandem arrangement of electrodes, either the electrode 140 is made of copper and the electrodes 141 and 142 are made of carbon, or vice versa. One or more of the electrodes 140, 141 and 142 may optionally be affixed to the stationary frame 110, the movable frame 111 and the movable frame 112, respectively, in a manner that allows slidable adjustment such that one or more of the electrodes 140-142 may be clampingly engaged by way of one or more of set screws 130 or other form of attachment hardware (e.g., a linear positioning slide, not shown). Additionally, a micrometer (not shown) may be incorporated or otherwise employed to aid in such slidable adjustment. Also, the electrode 141 may either be rigidly carried by the movable frame 111, or may be flexibly carried by the movable frame 111 by way of an electrode mount 120 that is slidably connected to the movable frame 111 through a spring 121. Similarly, the electrode 142 may either be rigidly carried by the movable frame 112, or may be flexibly carried by the movable frame 112 by way of an electrode mount 122 that is slidably connected to the movable frame 112 through a spring 123.

The power source 210 provides the power used in testing the AFCI 900, or other electrical switching device. One conductor supplied by the power source 210 proceeds through the AFCI 900 and the power switch 211, when the power switch 211 is closed, and to the electrode 142. The current measuring device 220 may optionally be installed between the power switch 211 and the electrode 142 to monitor the flow of current therebetween. The other conductor supplied by the power source 210 is electrically connected to the AFCI 900 and proceeds to the load 212. Another conductor is electrically connected between the load 212 and the electrode 141. With the pair of electrodes 140 and 141 having one electrode in common with the other pair of electrodes 140 and 142, these two pairs of electrodes are electrically connected such that current flows through both pairs in series. The voltage measuring device 221 is coupled to both of electrodes 142 and 141 to monitor a differential voltage therebetween.

The controller 300 operates the stepper motor 114 to slidably move the movable frames 111 and 112 relative to the stationary frame 110, and may optionally be coupled to one or both of the limit switches 115 and 116 to detect when one or both of the movable frames 111 and 112 have been moved to predetermined limits. The controller 300 may also receive input from one or both of the current measuring device 220 and the voltage measuring device 221 to detect the presence and/or the characteristics of one or both of an arc between the electrodes 140 and 141 and an arc between the electrodes 140 and 142.

Performing a test of the AFCI 900, or other electrical switching device, with the testing apparatus 2000 is substantially similar to performing such a test with the testing apparatus 1000. The power switch 211 is first opened, the electrodes 141 and 142 are caused to be moved into contact with the electrode 140 by the controller 300 through the stepper motor 114 and the movable frames 111 and 112. The power switch 211 is then closed to cause a flow of current generated by the power source 210 across the electrodes 140-142 and through the load 212. The electrodes 141 and 142 are then caused to move away from the electrode 140 at a slow enough speed to allow the initiation of arcs between the electrodes 140 and 141 and between the electrodes 140 and 142 to be detected, and to allow the movement of the electrodes 141 and 142 away from the electrode 140 to be altered in response to the initiation of these arcs.

The initiation of an arc may be detected by monitoring for one or more electrical events caused by the initiation of an arc in which the flow of current through the electrodes 140, 141 and/or 142 changes. In some embodiments, the initiation of one or more arcs may be detected by the controller 300 through the detection of the combined arc voltages between the electrodes 140 and 141 and between the electrodes 140 and 142 as measured between the electrodes 141 and 142 by the voltage measuring device 221. Alternatively, separate arc voltages may be detected by the controller 300 through separate voltage measuring devices (not shown), with one voltage measuring device measuring the voltage between the electrodes 140 and 141 and another measuring the voltage between the electrodes 140 and 142. In other embodiments, the initiation of an arc may be detected by the controller 300 through the detection by the current measuring device 220 of a flow of current through the electrodes 140-142 of a magnitude that is less than what is present when the electrodes 140, 141 and 142 are in contact with each other. Upon detecting the initiation of arcs across both the electrodes 140 and 141 and the electrodes 140 and 142, movement of the electrodes 141 and 142 away from the electrode 140 is caused to be altered by the controller 300 to maintain both arcs. When the arcs are no longer needed, they may be caused to cease by movement of the electrodes 141 and/or 142 further away from the electrode 140 until one or both arcs have been quenched, by movement of the electrodes 141 and 142 into contact with the electrode 140, or by opening the power switch 211. Although not necessary to performing a test of the AFCI 900, it may be desirable to have initiation of an arc between the electrodes 140 and 141 occur substantially simultaneously (or at least quite close to substantially simultaneously) with initiation of an arc between the electrodes 140 and 142. This may be enabled by providing for slidably adjusting the position of one or more of the electrodes 140-142 by way of clamping engagement with the set screws 130, as previously discussed, or by another mechanism.

Figure 4:
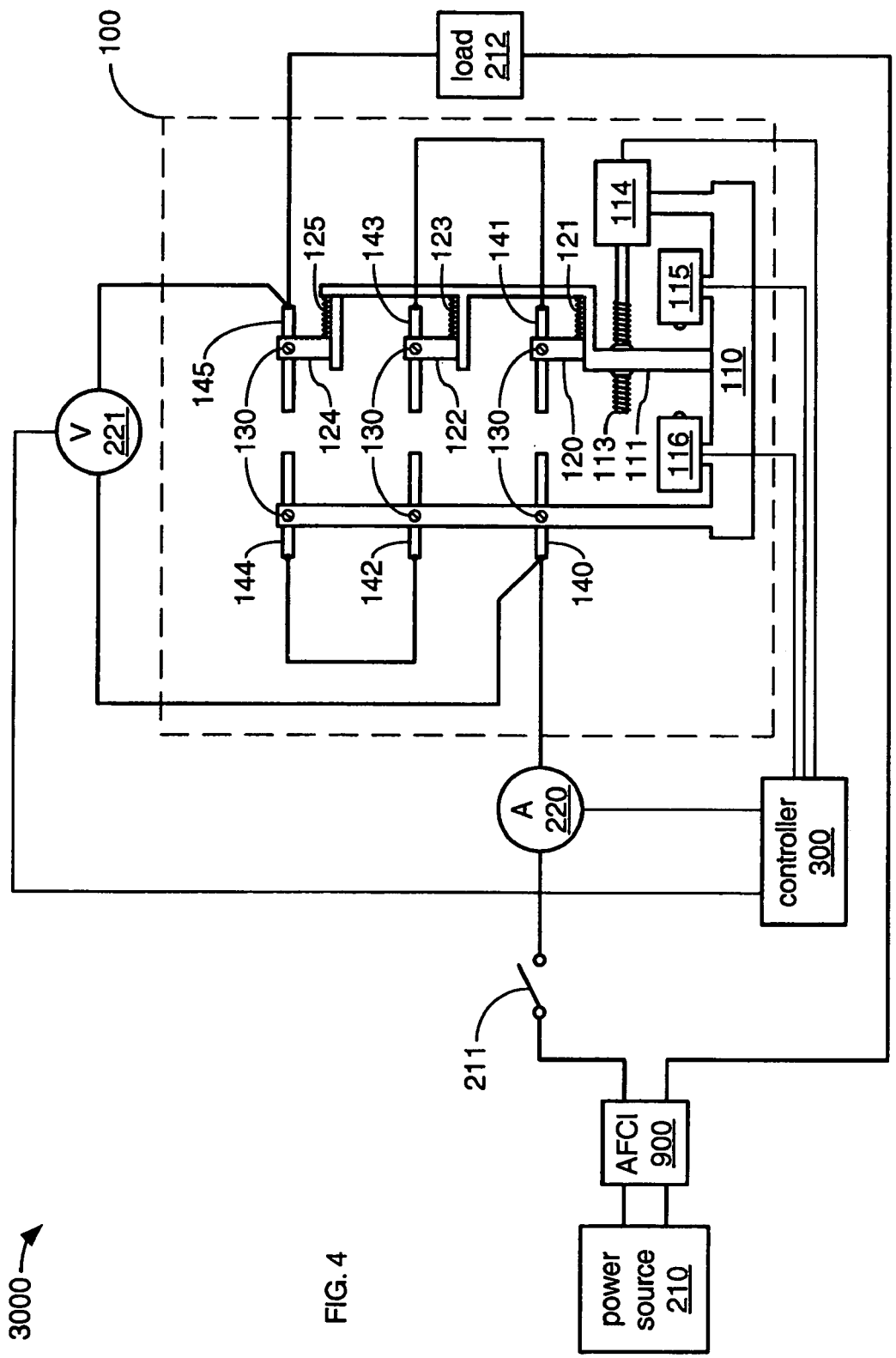

FIG. 4 depicts another testing apparatus 3000 to test the AFCI 900. Like the testing apparatus 2000 of FIG. 3, the testing apparatus 3000 of FIG. 4 is substantially similar to the testing apparatus 1000 of FIG. 1, and accordingly, the majority of numbered items of are identical, or at least substantially similar, between the testing apparatus 1000 and the testing apparatus 3000, and therefore, have been designated with identical numbering. The most substantial difference is that the testing apparatus 3000 employs three pairs of electrodes in a parallel arrangement to repeatably generate three arcs to test the AFCI 900, whereas the testing apparatus 1000 employs only one pair of electrodes to repeatably generate a single arc to test the AFCI 900.

More specifically, like the testing apparatus 1000 of FIG. 1, the testing apparatus 3000 of FIG. 4 incorporates an arc generator 100 coupled to a power source 210, a power switch 211, a load 212, a controller 300, and at least one electrical measuring device such as one or both of a current measuring device 220 and a voltage measuring device 221. The arc generator 100 incorporates a stationary frame 110 relative to which a movable frame 111 is slidably moved by an electromechanical device mounted on the stationary frame 110 such as a stepper motor 114 driving a worm gear 113 or other mechanical linkage. One or both of limit switches 115 and 116 may optionally also be affixed to the stationary frame 110 to be engaged by the movable frame 111 during movement relative to the stationary frame 110.

However, unlike the testing apparatus 1000 of FIG. 1, both the stationary frame 110 and the movable frame 111 of the arc generator 100 of the testing apparatus 3000 of FIG. 4 carry three electrodes. Carried by the stationary frame 110 are electrodes 140, 142 and 144, and carried by the movable frame 111 are electrodes 141, 143 and 145. As can be seen in FIG. 4, the electrodes 140, 142 and 144 are arranged so as to be paired with the electrodes 141, 143 and 145, respectively, and so as to generate three arcs. One or more of the electrodes 140-145 may optionally be affixed to their respective ones of the stationary frame 110 and the movable frame 111 in a manner that allows slidable adjustment such that one or more of the electrodes 140-145 may be clampingly engaged by way of one or more of set screws 130 or other form of attachment hardware. Additionally, a micrometer (not shown) may be incorporated into such attachment hardware or otherwise employed to aid in such slidable adjustment. Also, one or more of the electrodes 141, 143 and 145 either may be rigidly carried by the movable frame 111, or may be flexibly carried by the movable frame 111 by way of an electrode mount 120, 122 and 124 that is slidably connected to the movable frame 111 through a spring 121, 123 and 125, respectively.

The power source 210 provides the power used in testing the AFCI 900, or other electrical switching device. One conductor supplied by the power source 210 proceeds through the AFCI 900 and the power switch 211, when the power switch 211 is closed, and to the electrode 140. The current measuring device 220 may optionally be installed between the power switch 211 and the electrode 140 to monitor the flow of current therebetween. The other conductor supplied by the power source 210 is electrically connected to the AFCI 900 and proceeds to the load 212. Another conductor electrically connects the electrode 145 to the load 212. The electrode 141 is electrically connected to the electrode 143 and the electrode 142 is electrically connected to the electrode 144 with the result that the three pairs of electrodes (140 and 141, 142 and 143, 144 and 145) are electrically connected such that current flows through all three pairs in series. The voltage measuring device 221 is coupled to both of electrodes 140 and 145 to monitor a differential voltage therebetween. Alternatively, one or more voltage measuring devices (not shown) may measure the differential voltage across one or more of the three pairs of electrodes.

The controller 300 operates the stepper motor 114 to slidably move the movable frame 111 relative to the stationary frame 110. The controller may receive input from one or both of the current measuring device 220 and the voltage measuring device 221 to detect the presence and/or the characteristics of arcs between one or more of the three pairs of electrodes. The controller 300 may be manually operated to effect movement of the movable frame 111 to move the electrodes 141, 143 and 145 towards or away from the electrodes 140, 142 and 144, respectively. Alternatively, the controller 300 may be programmed or otherwise configured to automatically effect movement of the movable frame 111 as part of initiating and/or controlling characteristics of arcs between one or more of the three pairs of electrodes to perform tests of the AFCI 900, or other electrical switching device.

Performing a test of the AFCI 900, or other electrical switching device, with the testing apparatus 3000 is substantially similar to performing such a test with the testing apparatuses 1000 and 2000. The power switch 211 is first opened, the electrodes 141, 143 and 145 are caused to be moved into contact with the electrodes 140, 142 and 144 by the controller 300 through the stepper motor 114 and the movable frame 111. The power switch 211 is then closed to cause a flow of current generated by the power source 210 across the electrodes 140 and 141, across the electrodes 142 and 143, across the electrodes 144 and 145, and through the load 212. The electrodes 141, 143 and 145 are then caused to move away from the electrodes 140, 142 and 144, respectively, at a slow enough speed to allow the initiation of arcs between the electrodes 140 and 141, between the electrodes 142 and 143 and between the electrodes 144 and 145 to be detected, and to allow the movement of the electrodes 141, 143 and 145 to be altered in response to the initiation of these arcs.

The initiation of an arc may be detected by monitoring with an electrical measuring device for one or more electrical events indicative of the initiation of one or more arcs in which the flow of current through one or more of the three pairs of electrodes changes. In some embodiments, the initiation of an arc may be detected by the controller 300 through the detection of the combined arc voltages of all of the three pairs of electrodes as measured between the electrodes 140 and 145 by the voltage measuring device 221. Alternatively, separate arc voltages may be detected by the controller 300 through separate voltage measuring devices (not shown), with one voltage measuring device measuring the voltage between the electrodes 140 and 141, another measuring the voltage between the electrodes 142 and 143, and still another measuring the voltage between the electrodes 144 and 145. In other embodiments, the initiation of an arc may be detected by the controller 300 through the detection of a flow of current through the electrode 140 of a magnitude that is less than is present when the electrodes 140, 142 and 144 are in contact with electrodes 141, 143 and 145, respectively, by the current measuring device 220. Upon detecting the initiation of arcs across all of the three pairs of electrodes, movement of the electrodes 141, 143 and 145 away from the electrodes 140, 142 and 144, respectively, is caused to be altered by the controller 300 to maintain all three arcs. When the arcs are no longer needed, they may be caused to cease by movement of the electrodes 141, 143 and 145 further away from the electrodes 140, 142 and 144 until at least one of the three arcs quenches, resulting in an open circuit, by movement of the electrodes 141, 143 and 145 into contact with the electrodes 140, 142 and 144, or by opening the power switch 211. Although not necessary to performing a test of the AFCI 900, it may be desirable to have initiation of arcs between the electrodes 140 and 141, between the electrodes 142 and 143, and between the electrodes 144 and 145 occur substantially simultaneously, or at least quite close to substantially simultaneously. This may be enabled by providing either for slidably adjusting the position of one or more of the electrodes 140-145 by way of clamping engagement with the set screws 130, as previously discussed, or by another mechanism.

Figure 5:
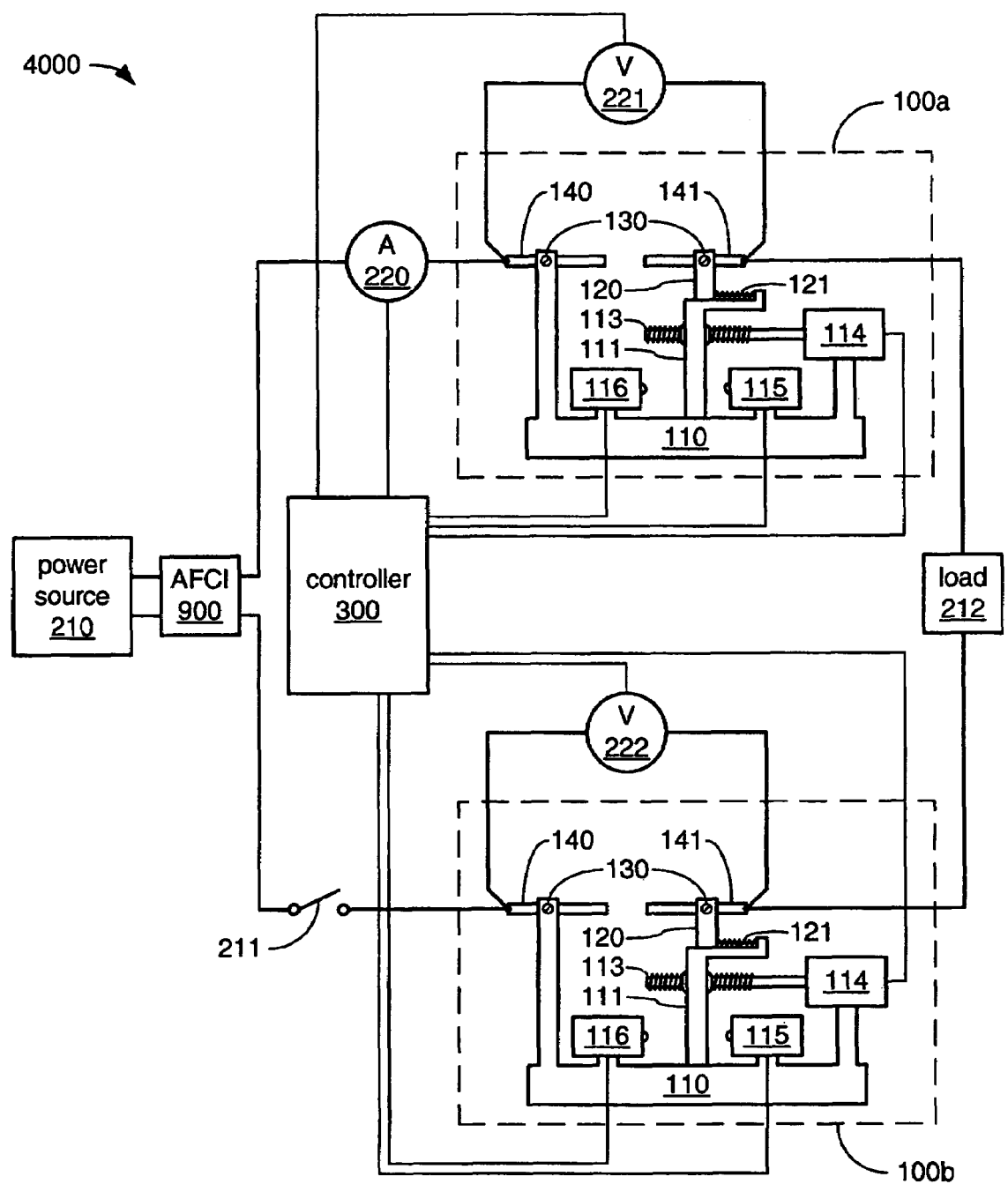

FIG. 5 depicts still another testing apparatus 4000 to test the AFCI 900. The testing apparatus 4000 is substantially similar to the testing apparatus 1000 of FIG. 1, with the exception of incorporating two arc generators 100a and 100b, instead of the single arc generator 100 of the testing apparatus 1000. However, the two arc generators 100a and 100b of the testing apparatus 4000 are substantially identical to the single arc generator 100 of the testing apparatus 1000. Accordingly, the majority of numbered items of are identical, or at least substantially similar, between the testing apparatus 1000 and the testing apparatus 4000, and therefore, have been designated with identical numbering.

Like the testing apparatuses 2000 and 3000 of FIGS. 3 and 4, respectively, the testing apparatus 4000 of FIG. 5 incorporates a controller 300 to control the repeated generation of multiple arcs between electrodes that are electrically connected in series. However, unlike those testing apparatuses, testing apparatus 4000 employs at least two mechanically independent arc generators 100a and 100b, in place of a single arc generator having multiple electrodes are moved on a common movable frame to generate the multiple arcs. Each of arc generators 100a and 100b incorporate substantially the identical frame and mechanical linkage structures as the arc generator 100 of the testing apparatus 1000 to controllably move one electrode 141 relative to another electrode 140.

The power source 210 provides the power used in testing the AFCI 900, or other electrical switching device. One conductor supplied by the power source 210 proceeds through the AFCI 900 and a power switch 211, when the power switch 211 is closed, and to the electrode 140 of the arc generator 100b. The other conductor supplied by the power source 210 is electrically connected to the AFCI 900 and proceeds to the electrode 140 of the arc generator 100a. A current measuring device 220 may optionally be installed between the power source 210 and the electrode 140 of the arc generator 100a to monitor the flow of current therebetween. Another conductor electrically connects the electrode 141 of the arc generator 100a to the load 212, and still another conductor electrically connects the load 212 to the electrode 141 of the arc generator 100b, with the result that current flows through both pairs of electrodes 140 and 141 in series. As depicted, voltage measuring devices 221 and 222 are each coupled to one of the pairs of the electrodes 140 and 141 to monitor a differential voltage therebetween.

The controller 300 operates a stepper motor 114 of each of the arc generators 100a and 100b to slidably move a corresponding one of the electrodes 141 towards and away from a corresponding one of the electrodes 140. The controller may receive input from one or more of the current measuring device 220 and the voltage measuring devices 221 and/or 222 to detect the presence and/or the characteristics of arcs between one or more of the two pairs of electrodes. The controller 300 may be manually operated to effect movement of the electrodes 141 of each of the arc generators 100a and 100b. Alternatively, the controller 300 may be programmed or otherwise configured to automatically effect movement of each of the electrodes 141 as part of initiating and/or controlling characteristics of arcs between one or both of the two pairs of electrodes to perform tests of the AFCI 900, or other electrical switching device.

Performing a test of the AFCI 900, or other electrical switching device, with the testing apparatus 4000 is largely similar to performing such a test with the testing apparatus 1000 of FIG. 1. The power switch 211 is first opened, both of the electrodes 141 are caused to be moved into contact with corresponding ones of the electrodes 140 by the controller 300 through operation of corresponding ones of the stepper motors 114. The power switch 211 is then closed to cause a flow of current generated by the power source 210 across both pairs of the electrodes 140 and 141, and through the load 212. Each of the electrodes 141 are then caused to move away from the corresponding ones of the electrodes 140 at a slow enough speed to allow the initiation of arcs between each pair of the electrodes 140 and 141 to be detected, and to allow the movement of each of the electrodes 141 to be altered in response to the initiation of these arcs.

As with the testing apparatuses 1000, 2000 and 3000, the initiation of an arc may be detected by monitoring with an electrical measuring device for one or more electrical events indicative of the initiation of one or more arcs in which the flow of current through one or both of the two pairs of electrodes changes. In some embodiments, the initiation of an arc may be detected by the controller 300 through the detection of the combined arc voltages of both pairs of electrodes as measured between both of the electrodes 140 by a single voltage measuring device (not shown). Alternatively, separate arc voltages may be detected by the controller 300 through separate voltage measuring devices 221 and 222, as depicted. In other embodiments, the initiation of an arc between one or both of the pairs of electrodes may be detected by the controller 300 through the detection of a flow of current through the electrode 140 of the arc generator 100a (or through another of the electrodes) of a magnitude that is less than is present when both pairs of the electrodes 140 and 141 are in contact with the current measuring device 220. Upon detecting the initiation of arcs across each of the pairs of electrodes, movement of the corresponding ones of the electrodes 141 away from the corresponding ones of the electrodes 140 is caused to be altered by the controller 300 to maintain each arc. When the arcs are no longer needed, they may be caused to cease either by movement of at least one of the electrodes 141 further away from the corresponding one of the electrodes 140 until at least one of the two arcs quenches, resulting in an open circuit, by movement of both of the electrodes 141 into contact with the corresponding ones of the electrodes 140, or by opening the power switch 211.

Although not necessary to performing a test of the AFCI 900, it may be desirable to have initiation of arcs between each of the pairs of electrodes 140 and 141 occur substantially simultaneously, or at least quite close to substantially simultaneously. This may be enabled by providing either for slidably adjusting the position of one or more of the electrodes among the two pairs of electrodes 140 and 141 by way of clamping engagement with the set screws 130, as previously discussed, or by another mechanism. Alternatively, this may be enabled by carrying out a test of the testing apparatus 4000, itself, before carrying out a test of the AFCI 900. In such a test of the testing apparatus 4000, each of the electrodes 141 is moved towards the corresponding one of the electrodes 140 to determine at what position each of the electrodes 141 makes contact with the corresponding one of the electrodes 140. These positions may be recorded by the controller 300 and then employed in subsequently moving both of the electrodes 141 in synchronization with each other such that arcs are initiated between each of the pairs of the electrodes 140 and 141 at substantially the same time.

Figure 6:
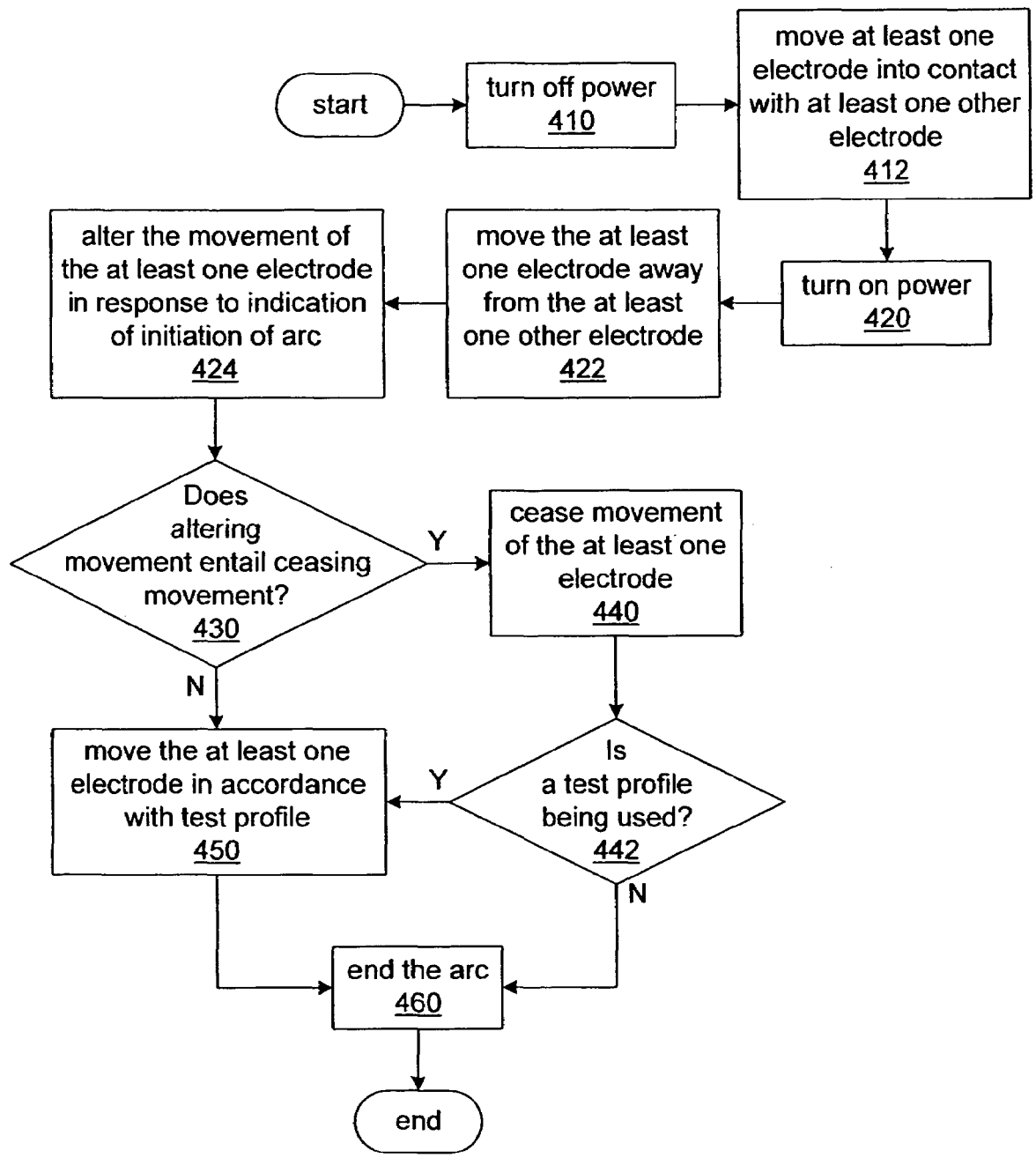
FIG. 6 is a flowchart of a test procedure in accordance with an embodiment of the invention.

FIG. 6 is a flowchart of an example test procedure. Starting at 410, power used by a testing apparatus such as test apparatuses 1000, 2000 or 3000 to generate an arc is turned off prior to moving at least one electrode into contact with at least one other electrode at 412. Though not actually necessary to testing features of an electrical switching device, such as the AFCI 900, turning off the power at 410 (or at least ensuring that the power is off) is a good safety practice, and prevents unwanted arcs from being generated as the electrodes are brought into contact with each other. It should be noted that in some embodiments, the power used to generate an arc may be turned on and off with a relay or solid state switching device under the control of an automated apparatus such as the controller 300 to further enhance safety by removing this opportunity for human error. With all pairs of electrodes moved into contact with each other at 412, the power used to generate at least one arc and test an electrical switching device is turned on at 420. At 422, the at least one electrode is moved away from the at least one other electrode, and at 424, this movement of the at least one electrode is altered in response to detecting an electrical event indicative of an initiation of an arc.

Such a detected electrical event indicative of the initiation of an arc may be, and without limitation, a change in current or a change in voltage. Detecting an arc by detecting a change of current entails detecting a change from a high level of current caused by the at least one electrode being in contact with the at least one other electrode to a slightly reduced level of current caused by the at least one electrode being pulled away from contact with the at least one other electrode, but with an arc existing therebetween. If the arc is quenched, then the current drops to zero. Detecting an arc by detecting a change in voltage entails detecting the change, from a substantially zero differential voltage between the at least one electrode and the at least one other electrode caused by the two electrodes being in contact, to a non-zero voltage caused by the at least one electrode being pulled away from contact with the at least one other electrode, but with an arc existing therebetween. It should be noted that arcs exhibit considerable random behavior such that both the current flowing across two electrodes with an arc therebetween and the differential voltage between those two electrodes fluctuates. A differential voltage resulting from the presence of an arc is referred to as an arc voltage, and where one copper electrode and one carbon electrode are used, the arc voltage typically averages approximately 15 to 20 volts where the arc is in a normal air environment.

At 430, if altering the movement of the at least one electrode entails ceasing movement of the at least one electrode, then movement of the at least one electrode is ceased at 440. At 442, if a test profile is being used, then at 450, the at least one electrode is subsequently moved to one or more positions with the timing of each move, the length of time at which each position is maintained, and the location of each position being determined by an earlier-generated profile to alter characteristics of the arc as a function of the distance between the two electrodes. Any of a number of possible patterns may be devised to test various aspects of an electrical switching device, such as the AFCI 900. Otherwise, at 442, if no test profile is being used such that the arc only need be maintained at the position at which its movement was ceased long enough to perform one or more tests of an electrical switching device, then after the arc is no longer needed, the arc is ended at 460. As previously discussed, ending the arc may be done by moving the at least one electrode still further away from the at least one other electrode to quench the arc, by moving the at least one electrode into contact with the at least one other electrode, or by simply turning off the power used for the test.

Alternatively, at 430, if altering the movement of the at least one electrode entails changing the speed and/or direction of the movement, then such a change or changes take place at 450 as the at least one electrode is moved to one or more positions with the timing of each move, the length of time at which each position is maintained, and the location of each position being determined by an earlier-generated profile to alter characteristics of the arc as a function of the distance between the two electrodes. Then, after the arc is no longer needed, the arc is ended at 460, as previously discussed.

Figure 7:
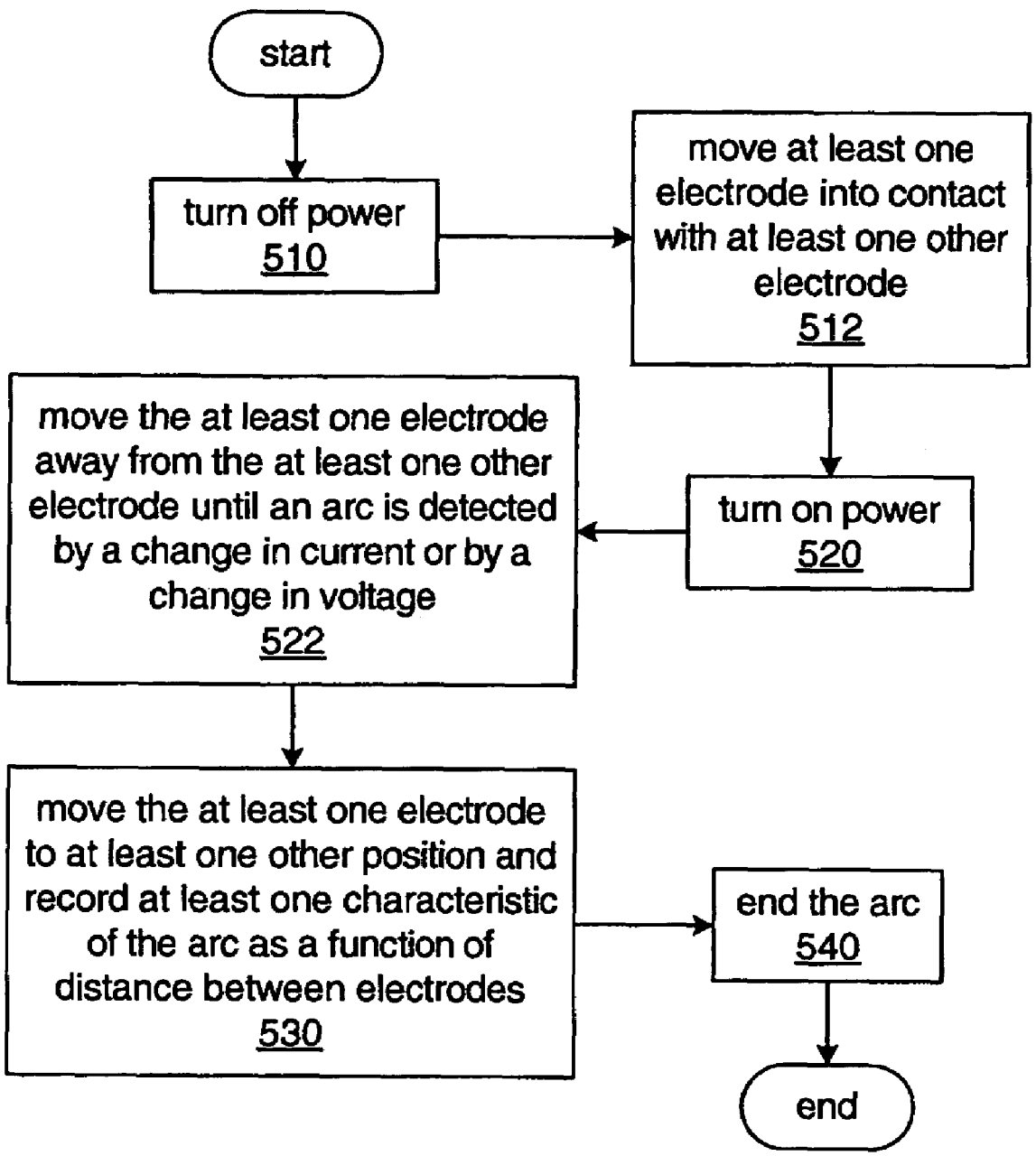
FIG. 7 is a flowchart of a profile data gathering procedure in accordance with an embodiment of the invention.

FIG. 7 is a flowchart of an example procedure for gathering data to generate a test profile. The power used to generate an arc is turned off at 510, before moving the at least one electrode into contact with the at least one other electrode at 512. Power to generate an arc is then turned on at 520, and at 522, the at least one electrode is moved away from the at least one other electrode until an indication of the initiation of an arc is detected, at which time movement of the at least one electrode is altered. In altering the movement of the at least one electrode, the movement may simply be ceased, followed by a subsequent movement at 530, or the speed and/or direction of the movement may be changed as part of beginning the subsequent movement at 530. The subsequent movement at 530 entails the at least one electrode being moved to and held at one or more positions to enable measurement of one or more characteristics of the arc (e.g. and without limitation, the current flowing through the arc or the differential voltage of the two electrodes) as a function of the distance between the at least one electrode and the at least one other electrode at 530. Movement of the at least one electrode relative to the at least one other electrode may be effected either by commands input to a controller operating a stepper motor or other electromechanical component of the testing apparatus so that changes in characteristics of the arc may be observed or measured. Alternatively, movement of the at least one electrode relative to the at least one other electrode may be under the control of a preselected sequence of movements fed into a controller to either measure changes or verify predicted changes in characteristics of the arc with the controller including a suitable recording device to record the characteristics observed during the procedure.

As previously discussed, it has been observed that although much of the behavior of an arc is very random, the degree of randomness is susceptible to some amount of control based on the distance between the two electrodes employed in generating the arc. Generally, the greater the distance between two such electrodes, the greater the degree of randomness in behavior such that both the current flowing through the arc and the differential voltage between the two electrodes undergo fluctuations of greater magnitude. In other words, it is possible to exercise some degree of control over the magnitude of the fluctuations in both current and differential voltage so as to devise various test profiles (e.g., profile 331 discussed earlier with regard to FIG. 2) in which an electrical switching device is subjected to differing preselected magnitudes of fluctuation in current and voltage.

Observations of arcs in various forms of copper wiring with plastic insulators, such as typical appliance cords and extension cords, have shown that the magnitudes of random fluctuations of current flowing through an arc generated therein and differential voltages can both be considerably greater than is possible to generate with a single arc between a copper electrode and a carbon electrode. By generating multiple arcs between electrodes arranged in tandem and/or electrically connected in series, it has been found that these greater magnitudes can be more closely approximated.

It should be noted that although discussions of distances of movement and locations have centered largely on the relative distance between electrodes, those skilled in the art will readily understand that other approaches to measuring distances and locations may be employed, including the use of other forms of reference point. However, experience in testing apparatuses such as testing apparatuses 1000, 2000 and 3000 has demonstrated the efficacy of measuring distances and locations using the location of an electrode at which an arc is initiated as the point of reference for all distance measurements. Doing so eliminates much of the need to be concerned with the accuracy of the positions of the electrodes in relation to the stationary frame 110 or other parts of such an apparatus, which can become quite onerous given that the distances involved in measuring where an arc is quenched or where a desired degree of randomness in an arc is achieved relative to where it is initiated is measurable in mere micrometers or fractions of micrometers. Also, this task is made more onerous by the constantly changing dimensions of carbon electrodes, because with the generation of each arc, a portion of the carbon electrode is lost. Therefore, using the location of a electrode at which an arc is initiated as the point of reference for all distances enables the progressive loss of portions of the carbon electrode to already be factored into the distance measurements each time a new arc is initiated. Specifically, where an electromechanical device is employed that enables movement in discrete increments, such as the stepper motor 114, and where the change in position in micrometers or fraction(s) of a micrometer with each discrete movement is known, changes in position of an electrode relative to the position it occupied when an arc was initiated may be known with certainty by maintaining a count of the number of discrete increments of movement employed to move that electrode in a given direction. The same discrete increments employed in moving an electrode may also be employed in creating test profiles (e.g., profile 331) wherein distances are specified as a number of discrete movements from the location at which an arc was initiated.

It should also be noted that although discussions of the mechanism used in moving at least one electrode have centered on the use a stepper motor with a worm gear, those skilled in the art will readily recognize that other forms of electromechanical device (e.g., without limitation, a linear motor) and/or other forms of mechanical linkage (e.g., without limitation, a chain, belt, or rack and pinion) may be employed. Furthermore, a non-electromechanical mechanism may also be employed, such as a piston under hydraulic or pneumatic power. However, experience in testing apparatuses such as testing apparatuses 1000, 2000, 3000 and 4000 has demonstrated that combinations of stepper motors and worm gears with sufficient accuracy and lack of play between components may be employed to readily achieve the desired sub-micrometer degree of control and accuracy.

It should be further noted that although discussions of the electrodes have centered on one electrode being made of copper and the other one of carbon, as per the UL1699 specification, electrodes made of other materials or other combinations of materials may also be employed. It may be desirable to simulate the generation of arcs under other conditions than the earlier-discussed case of carbon molecules forming in wiring.

The use of an electrical measuring device to detect the initiation of an arc and the use of an electromechanical device in moving an electrode allows for faster detection and response to the initiation of an arc than is humanly possible, and allows for either maintaining or enhancing characteristics of the arc with greater precision than is humanly possible. Additionally, such use of an electrical measuring device and electromechanical device makes possible the creation and use of testing profiles in which electrodes are moved relative to each other in a preprogrammed way to controllably vary arc characteristics, and thereby, vary testing conditions.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An apparatus comprising
   a stationary frame;
   a movable frame;
   an additional movable frame;
   a first electrode mounted to the stationary frame;
   a second electrode mounted to the movable frame;
   a third electrode mounted to the additional movable frame;
   an electromechanical device rigidly connected to the stationary frame and drivingly connected to the movable frame and to the additional movable frame to move the movable frame to move the second electrode into and out of contact with the first electrode, and to move the additional movable frame to move the third electrode into and out of contact with the first electrode; and
   a controller structured to operate the electromechanical device to move the second electrode into contact with the first electrode and to move the third electrode into contact with the first electrode, to receive data from at least one electrical measuring device providing an indication of initiation of at least one of an arc between the first electrode and the second electrode and an arc between the first electrode and the third electrode, to operate the electromechanical device to move the second electrode away from contact with the first electrode and move the third electrode away from contact with the first electrode, and to operate the electromechanical device to alter movement of the second electrode and the third electrode in response to receiving the indication of initiation.

2. The apparatus of claim 1, wherein the at least one measuring device is a voltage measuring device electrically connected to the third electrode and the second electrode.

3. An apparatus comprising:
   a stationary frame;
   a movable frame;
   a first electrode mounted to the stationary frame;
   a second electrode mounted to the movable frame;
   an electromechanical device rigidly connected to the stationary frame and drivingly connected to the movable frame to move the movable frame along a path of travel to move the second electrode into and out of contact with the first electrode;
   a controller structured to operate the electromechanical device, to receive data providing an indication of initiation of an arc between the first electrode and the second electrode from at least one electrical measuring device detecting an electrical event indicative of the initiation of an arc, to operate the electromechanical device to move the second electrode away from contact with the first electrode, and to operate the electromechanical device to alter movement of the second electrode in response to receiving the indication of initiation of an arc between the first electrode and the second electrode; and
   wherein a third electrode is mounted to the stationary frame; and wherein a fourth electrode is mounted to the movable frame such that as the movable frame is moved by the electromechanical device to bring the second electrode into contact with the first electrode, the fourth electrode is brought into contact with the third electrode.

4. A method of testing an electrical switching device, said method comprising:
   moving a second electrode into contact with a first electrode;
   moving the second electrode away from the first electrode;
   altering movement of the second electrode away from the first electrode in response to an indication of at least one electrical event from at least one electrical measuring device indicative of initiation of an arc between at least the first electrode and the second electrode; and
   varying the distance between the first electrode and the second electrode after receiving the indication of the at least one electrical event, and recording data concerning at least one characteristic of the arc as a function of the distance between the first electrode and the second electrode.

5. A method of testing an electrical switching device, said method comprising:
   moving a second electrode into contact with a first electrode;
   moving the second electrode away from the first electrode;
   altering movement of the second electrode away from the first electrode in response to an indication of at least one electrical event from at least one electrical measuring device indicative of initiation of an arc between at least the first electrode and the second electrode; and varying at least one characteristic of the arc, while maintaining the arc, by moving the second electrode to a plurality of locations between a first location at which the indication of at least one electrical event was received and a second location at which the arc is quenched.

6. A method of testing an electrical switching device, said method comprising:
   moving a second electrode into contact with a first electrode;
   moving the second electrode away from the first electrode;
   altering movement of the second electrode away from the first electrode in response to an indication of at least one electrical event from at least one electrical measuring device indicative of initiation of an arc between at least the first electrode and the second electrode;
   moving a third electrode into contact with the first electrode;
   moving the third electrode away from the first electrode as the second electrode is moved away from the first electrode; and
   altering movement of the third electrode away from the first electrode in response to receiving the indication of at least one electrical event.

7. A method of testing an electrical switching device, said method comprising:
   moving a second electrode into contact with a first electrode;
   moving the second electrode away from the first electrode;
   altering movement of the second electrode away from the first electrode in response to an indication of at least one electrical event from at least one electrical measuring device indicative of initiation of an arc between at least the first electrode and the second electrode;
   moving a fourth electrode into contact with a third electrode;
   moving the fourth electrode away from the third electrode as the second electrode is moved away from the first electrode; and
   altering movement of the fourth electrode away from the third electrode in response to receiving the indication of the at least one electrical event.

8. A machine-readable medium on which a sequence of instructions are stored that when executed by a processor causes the processor to perform operations comprising:
   operating an electromechanical device under the control of the processor to move a second electrode into contact with a first electrode;
   operating the electromechanical device to move the second electrode out of physical contact with the first electrode;
   operating the electromechanical device to alter movement of the second electrode in response to receiving an indication of at least one electrical event indicative of initiation of an arc between the first electrode and the second electrode; and
   varying the distance between the first electrode and the second electrode after receiving the indication of at least one electrical event, and recording data concerning at least one characteristic of the arc as a function of the distance between the first electrode and the second electrode.

9. A machine-readable medium on which a sequence of instructions are stored that when executed by a processor causes the processor to perform operations comprising:
   operating an electromechanical device under the control of the processor to move a second electrode into contact with a first electrode;
   operating the electromechanical device to move the second electrode out of physical contact with the first electrode;
   operating the electromechanical device to alter movement of the second electrode in response to receiving an indication of at least one electrical event indicative of initiation of an arc between the first electrode and the second electrode; and
   varying at least one characteristic of the arc, while maintaining the arc, by moving the second electrode to a plurality of locations between a first location at which the indication of at least one electrical event was received and a second location at which the arc is quenched.

* * * * *